United States Patent
Woo

(10) Patent No.: US 9,324,805 B2
(45) Date of Patent: Apr. 26, 2016

(54) FLEXIBLE GRAPHENE SWITCHING DEVICE

(71) Applicant: Samsung Electronics Co., Ltd., Suwon-Si, Gyeonggi-Do (KR)

(72) Inventor: Yun-sung Woo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 90 days.

(21) Appl. No.: 14/265,670

(22) Filed: Apr. 30, 2014

(65) Prior Publication Data
US 2015/0129839 A1    May 14, 2015

(30) Foreign Application Priority Data
Nov. 12, 2013 (KR) .................. 10-2013-0137116

(51) Int. Cl.
| | |
|---|---|
| *H01L 29/772* | (2006.01) |
| *H01L 29/16* | (2006.01) |
| *H01L 29/06* | (2006.01) |
| *H01L 29/78* | (2006.01) |

(52) U.S. Cl.
CPC ........ *H01L 29/1606* (2013.01); *H01L 29/0673* (2013.01); *H01L 29/7839* (2013.01)

(58) Field of Classification Search
CPC ..................... H01L 29/1606; H01L 29/0673
See application file for complete search history.

(56) References Cited

U.S. PATENT DOCUMENTS

| | | | |
|---|---|---|---|
| 8,461,571 B2 | 6/2013 | Colli | |
| 2011/0121264 A1 | 5/2011 | Choi et al. | |
| 2012/0033367 A1 | 2/2012 | Jones et al. | |
| 2012/0161106 A1 | 6/2012 | Kim et al. | |
| 2012/0223288 A1* | 9/2012 | Kim ................ B82Y 10/00 257/9 |
| 2012/0318324 A1 | 12/2012 | Ning et al. | |
| 2013/0048947 A1 | 2/2013 | Grimes et al. | |
| 2013/0099196 A1 | 4/2013 | Wu et al. | |
| 2013/0105765 A1 | 5/2013 | Haensch et al. | |

FOREIGN PATENT DOCUMENTS

| | | |
|---|---|---|
| KR | 101013124 B1 | 2/2011 |
| KR | 101139577 B1 | 4/2012 |
| KR | 1020120111754 A | 10/2012 |
| KR | 101198301 B1 | 11/2012 |

* cited by examiner

*Primary Examiner* — Whitney T Moore
*Assistant Examiner* — Scott Stowe
(74) *Attorney, Agent, or Firm* — Harness, Dickey & Pierce, P.L.C.

(57) ABSTRACT

Provided is a graphene switching device including: a graphene layer formed on a substrate; a plurality of semiconductor nanowires on the substrate; a first electrode connected to a second end of the graphene layer; a second electrode on the substrate to face the first electrode so as to be connected to the plurality of semiconductor nanowires; a gate insulating layer on the substrate to cover the graphene layer; and a gate electrode on the gate insulating layer. The gate electrode and the plurality of semiconductor nanowires face each other with the graphene layer therebetween. At least one of the plurality of semiconductor nanowires is connected to at least one of the second electrode, the graphene layer, and the other of the plurality of semiconductor nanowires.

13 Claims, 5 Drawing Sheets

FLEXIBLE GRAPHENE SWITCHING DEVICE

RELATED APPLICATIONS

This application claims priority from Korean Patent Application No. 10-2013-0137116, filed on Nov. 12, 2013, in the Korean Intellectual Property Office, the disclosure of which is incorporated herein in its entirety by reference.

BACKGROUND

1. Field

The present disclosure relates to flexible switching devices including a tunable semiconductor barrier.

2. Description of the Related Art

Research has been conducted into transparent flexible transistors that are useful for transparent displays or touch panels or the like. The transparent flexible transistors include a channel formed of a conductive oxide such as ZnO or an organic material. The above oxides and organic materials are optically transparent but have significantly lower carrier mobility than conventional silicon transistors, and thus it is typically difficult to manufacture a flexible device using these materials.

Graphene is a zero gap semiconductor, and when graphene is used in manufacturing graphene nano-ribbon (GNR) with a channel width of 10 nm or less, a band gap is typically formed due to a size effect, and thus a field effect transistor which is operable at room temperature may be manufactured.

However, when manufacturing a graphene transistor using GNR, an ON/OFF ratio of a graphene transistor is improved but mobility thereof in the GNR decreases significantly due to disordered edges of the GNR, and an ON current of the graphene transistor is low.

Research has recently been conducted into graphene electronic devices using a Schottky barrier which is generated based on a difference in work functions of a semiconductor and graphene while still using graphene as a channel.

Consequently, a graphene electronic device that may be used in a flexible device and has a Schottky barrier at the same time is required.

SUMMARY

Provided are methods and apparatuses for flexible graphene switching devices including semiconductor nanowires to form a Schottky barrier.

Additional example embodiments will be set forth in part in the description which follows and, in part, will be apparent from the description, or may be learned by practice of the presented embodiments.

According to an example embodiment, a graphene switching device includes: a graphene layer on a substrate; a plurality of semiconductor nanowires on the substrate, at least one of the plurality of semiconductor nanowires being connected to a first end of the graphene layer; a first electrode connected to a second end of the graphene layer; a second electrode on the substrate to face the first electrode so as to be connected to the plurality of semiconductor nanowires; a gate insulating layer on the substrate to cover the graphene layer; and a gate electrode on the gate insulating layer, wherein the gate electrode and the plurality of semiconductor nanowires face each other with the graphene layer therebetween, and at least one of the plurality of semiconductor nanowires is connected to at least one of the second electrode, the graphene layer, and the other of the plurality of semiconductor nanowires.

The plurality of semiconductor nanowires may be doped with n-type or p-type impurities.

The plurality of semiconductor nanowires may include silicon, germanium, silicon-germanium, a III-V Group semiconductor, a II-VI group semiconductor or an organic semiconductor.

The graphene layer may be separated from the second electrode.

A distance between the graphene layer and the second electrode may be in a range from about 1 nm to about 30 nm.

The gate insulating layer may be formed of a polymer.

The graphene switching device may be a unipolar transistor having the same polarity as a polarity of impurities of the plurality of semiconductor nanowires.

The plurality of semiconductor nanowires may form an energy gap between the graphene layer and the second electrode, and the energy gap may be varied according to a gate voltage applied to the gate electrode.

The graphene layer may be formed of one to four graphene layers.

The substrate may be formed of a plastic.

The plurality of semiconductor nanowires may be distributed in a network form.

The plurality of semiconductor nanowires may be arranged in parallel to one another.

BRIEF DESCRIPTION OF THE DRAWINGS

These and/or other example embodiments will become apparent and more readily appreciated from the following description of the embodiments, taken in conjunction with the accompanying drawings in which.

DETAILED DESCRIPTION

Figure 1:
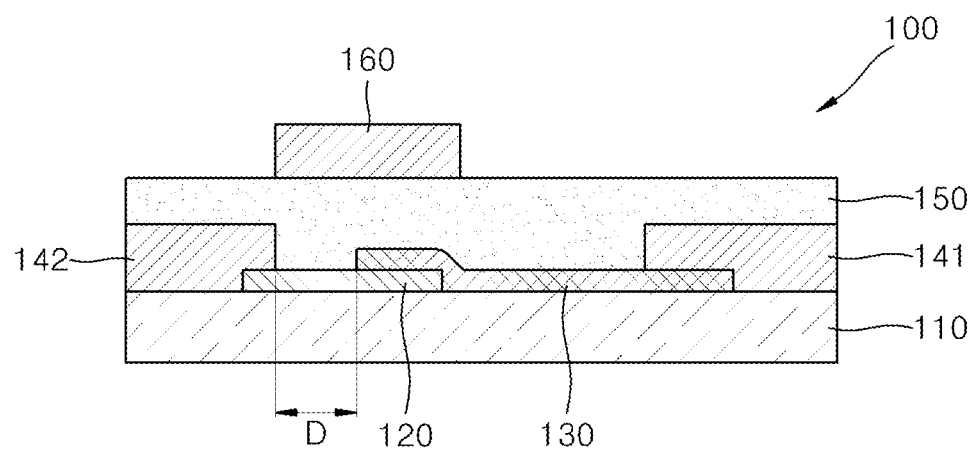
FIG. 1 is a schematic cross-sectional view illustrating a flexible graphene switching device including semiconductor nanowires according to example embodiments.

Reference will now be made in detail to embodiments, examples of which are illustrated in the accompanying drawings, wherein thicknesses of layers or regions illustrated in the drawings are exaggerated for clarity of description. In this regard, the present embodiments may have different forms and should not be construed as being limited to the descriptions set forth herein. It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

FIG. 1 is a schematic cross-sectional view illustrating a flexible graphene switching device 100 including semiconductor nanowires, according to example embodiments.

Referring to FIG. 1, a plurality of nanowires 120 are disposed on a substrate 110, according to at least one example embodiment. A graphene layer 130 is disposed on a side of the plurality of semiconductor nanowires 120. A first electrode 141 is disposed on the graphene layer 130 to face the semiconductor nanowires 120, and a second electrode 142 is disposed on other side of the semiconductor nanowires 120 and is spaced apart from the graphene layer 130. The second electrode 142 is disposed to face the first electrode 141 while having the semiconductor nanowires 120 and the graphene layer 130 therebetween.

According to at least one example embodiment, a gate insulating layer 150 is formed on the substrate 110 to cover the graphene layer 130 and the semiconductor nanowires 120, and a gate electrode 160 is disposed on the insulating layer 150. The gate electrode 160 is disposed to face the semiconductor nanowires 120 while having the graphene layer 130 therebetween.

According to at least one example embodiment, the substrate 110 is flexible. The substrate 110 may be formed of a flexible polymer. For example, the substrate 110 may be formed of polyethylenenaphthalate (PEN), polyethyleneterephthalate (PET), polycarbonate, polyvinylalcohol, polyacrylate, polyimide, polynorbornene or polyethersulfone (PES).

According to at least one example embodiment, the graphene layer 130 may be formed by transferring graphene onto the substrate 110 and patterning the graphene. The graphene may be fabricated using a chemical vapor deposition (CVD) method. The graphene layer 130 may be formed of one to four graphene layers. The graphene layer 130 is a path through which charge carriers move, and may have a zero band gap.

According to at least one example embodiment, the plurality of semiconductor nanowires 120 may be formed of silicon, germanium, silicon-germanium, a III-V Group semiconductor, a II-VI Group semiconductor, or an organic semiconductor.

Figure 2:
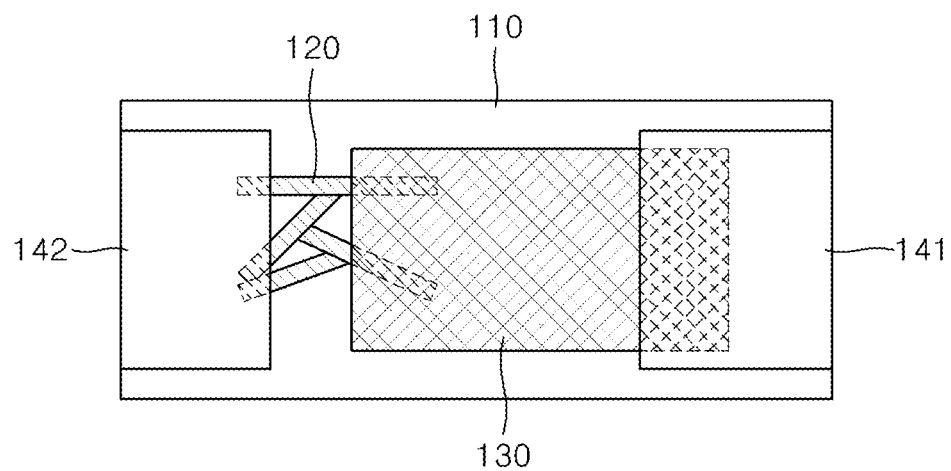
FIG. 2 is a plan view illustrating an arrangement of semiconductor nanowires according to example embodiments.

FIG. 2 is a plan view illustrating an arrangement of the semiconductor nanowires 120 according to example embodiments. Here, the gate insulating layer 150 and the gate electrode 160 are omitted for convenience.

Referring to FIG. 2, the plurality of semiconductor nanowires 120 are arranged in a network form, according to at least one example embodiment. The plurality of semiconductor nanowires 120 may be formed on the substrate 110 by mixing a plurality of semiconductor nanowires with water to prepare a mixture, distributing the mixture in a desired (or, alternatively, predetermined) area on the substrate 110, and drying the mixture. Each of the plurality of semiconductor nanowires 120 are disposed to contact at least one of the graphene layer 130, the second electrode 142 and adjacent semiconductor nanowires 120.

Figure 3:
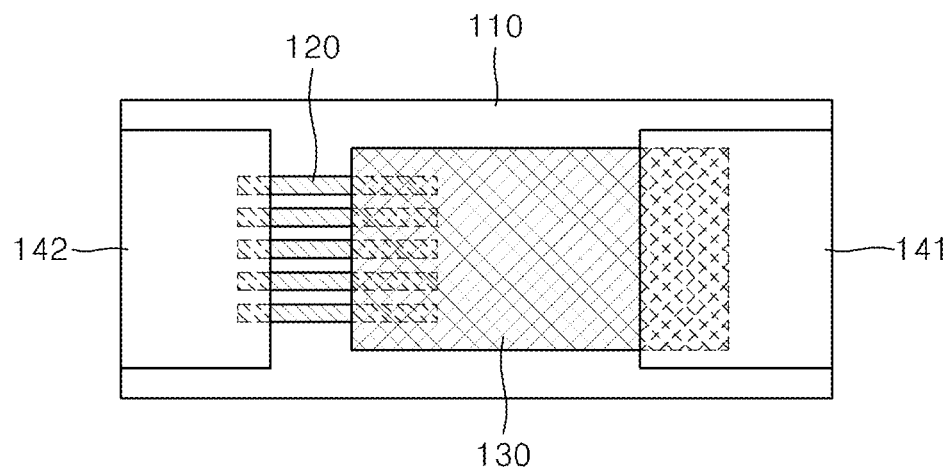
FIG. 3 is a plan view illustrating an arrangement of semiconductor nanowires according to example embodiments.

FIG. 3 is a plan view illustrating an arrangement of the semiconductor nanowires 120 according to example embodiments. For convenience, the gate insulating layer 150 and the gate electrode 160 are omitted.

Referring to FIG. 3, according to at least one example embodiment, the plurality of semiconductor nanowires 120 are arranged in parallel to one another, and first ends of the plurality of semiconductor nanowires 120 are disposed to contact the graphene layer 130, and second ends of the plurality of semiconductor nanowires 120 are disposed to contact the second electrode 142. The plurality of semiconductor nanowires 120 may be formed by etching a semiconductor layer on another substrate and then transferring the plurality of semiconductor nanowires 120 on the substrate 110 in parallel.

According to at least one example embodiment, one of the first electrode 141 and the second electrode 142 is a source electrode and the other is a drain electrode. For example, the first electrode 141 may be a source electrode, and the second electrode 142 may be a drain electrode. The first electrode 141 and the second electrode 142 and the gate electrode 160 may be formed of a metal or polysilicon.

According to at least one example embodiment, the gate insulating layer 150 may be formed of a silicon oxide, a silicon nitride, or a polymer such as poly(methylmethacrylate (PMMA) or poly(2-hydroxyethyl methacrylate (PHEMA).

Referring to FIG. 1, a length D of the semiconductor nanowires 120 exposed through the second electrode 142 and the graphene layer 130, that is, a gap between the second electrode 142 and the graphene layer 130 may be a distance for the charge carriers to tunnel, and may be about 1 nm to about 30 nm, according to at least one example embodiment. The semiconductor nanowires 120 are doped with one of n-type and p-type impurities. As illustrated in FIGS. 1 through 3, a portion of the semiconductor nanowires 120 are disposed to face the gate electrode 160 while having the graphene layer 130 therebetween. The semiconductor nanowires 120 may function as a Schottky barrier between the graphene layer 130 and the second electrode 142. The Schottky barrier may be adjusted using a gate voltage. Thus, the semiconductor nanowires 120 are a tunable barrier and are also referred to as a semiconductor barrier.

According to at least one example embodiment, the graphene switching device 100 including a tunable barrier may be a unipolar transistor which is an n-type transistor or a p-type transistor depending on a polarity of the semiconductor nanowires 120. That is, when the semiconductor nanowires 120 are doped with n-type impurities, the graphene switching device 100 is an n-type transistor, and when the semiconductor nanowires 120 are doped with p-type impurities, the graphene switching device 100 is a p-type transistor.

Figure 4A:
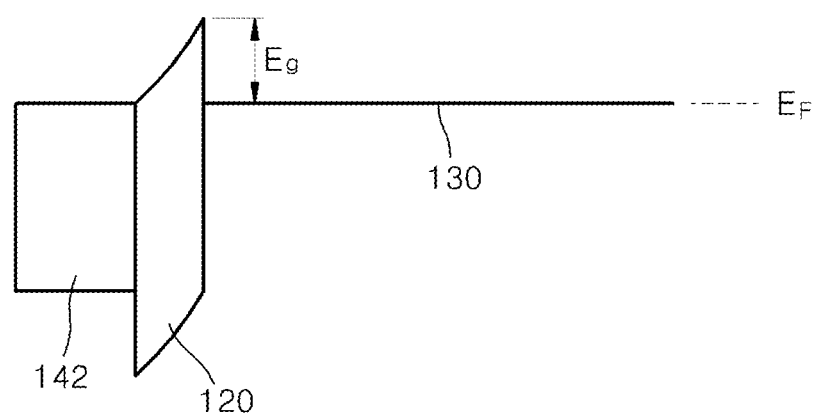
FIGS. 4A and 4B are energy band diagrams to explain an operation of a graphene switching device according to example embodiments.
Figure 4B:
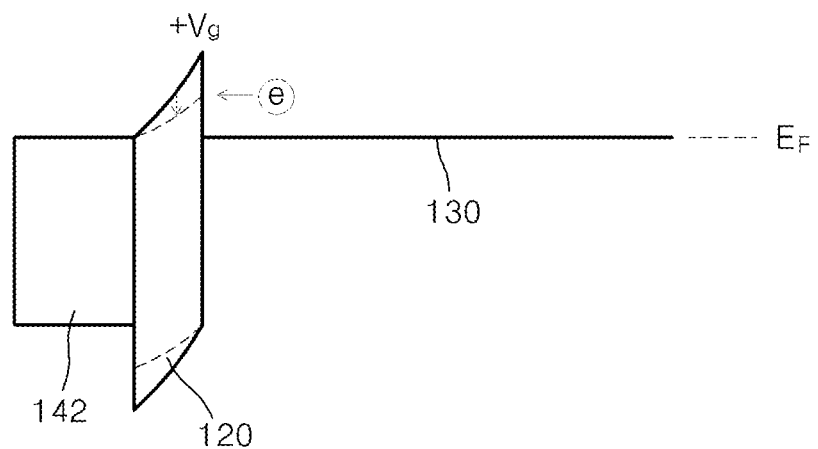

FIGS. 4A and 4B are energy band diagrams to explain an operation of the graphene switching device 100 according to example embodiments.

FIGS. 4A and 4B are views to explain an operation of an n-type graphene switching device, according to at least one example embodiment. FIG. 4A illustrates a state before applying a gate voltage, and FIG. 4B illustrates a state after applying a gate voltage.

Referring to FIG. 4A, while no gate voltage is applied to the gate electrode 160, energy bands of the graphene layer 130 and the second electrode 142 corresponding to respective work functions of the graphene layer 130 and the second electrode 142 are formed at both sides of the semiconductor nanowires 120. When the graphene switching device 100 includes the semiconductor nanowires 120 of an n-type, main charge carriers are electrons. The semiconductor nanowires 120 between the second electrode 142 and the graphene layer 130 function as an energy barrier therebetween. According to the current example embodiment, the semiconductor nanowires 120 may be referred to as semiconductor barriers. Due to an energy gap Eg between the graphene layer 130 and the semiconductor nanowires 120, movement of the charge carriers is restricted. In FIGS. 4A and 4B, $E_F$ denotes a Fermi energy level of the graphene layer 130.

Referring to FIG. 4B, while applying a desired (or, alternatively, predetermined) voltage to the second electrode 142 and to the first electrode 141, when a desired (or, alternatively, predetermined) positive gate voltage (+Vg) is applied to the gate electrode 160, the energy gap Eg of the semiconductor nanowires 120 decreases as indicated by a dotted line. Thus, electrons can more easily move from the graphene layer 130 to the second electrode 142. This indicates that a current may flow through the graphene switching device 100 because of the applied gate voltage, and thus, the graphene switching device 100 functions as a field effect transistor. The graphene layer 130 may function as a carrier path and may be different from a channel of a conventional field effect transistor.

Meanwhile, due to the decrease in the energy gap Eg, electrons may also pass through the semiconductor nanowires 120 due to a tunneling effect of the semiconductor nanowires 120, according to at least one example embodiment.

As the gate voltage increases, the energy gap Eg of the semiconductor nanowires 120 decreases further, according to at least one example embodiment. Thus, the energy gap Eg of the semiconductor nanowires 120 may be adjustable.

Figure 5:
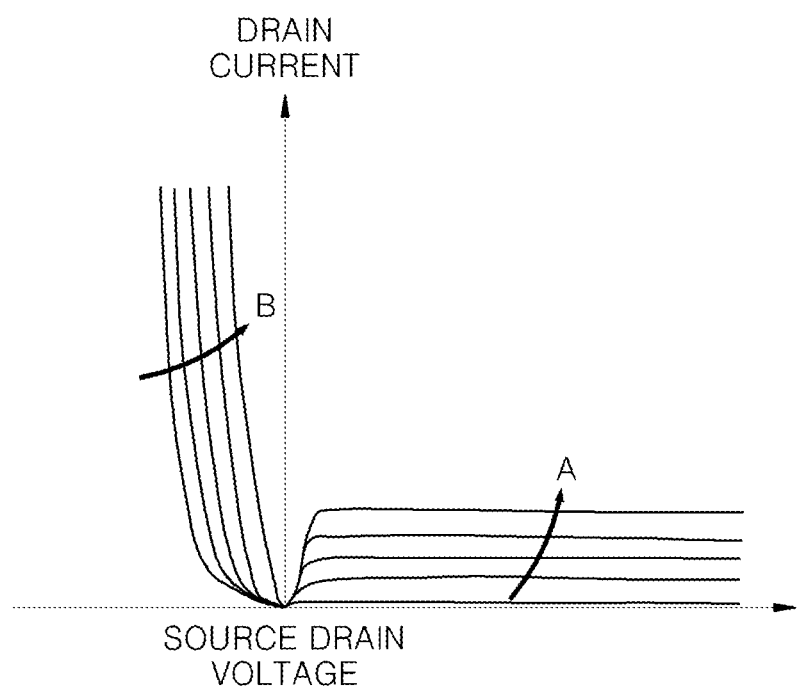
FIG. 5 is an I-V curve of an n-type graphene switching device according to example embodiments.

FIG. 5 is an I-V curve of an n-type graphene switching device according to example embodiments.

Referring to FIG. 5, when a source-drain voltage is positive, an energy gap decreases with an increase of a gate voltage, and a drain current increases in an arrow direction A.

Meanwhile, if a negative voltage is applied to the second electrode 142 of the graphene switching device 100 including the n-type semiconductor nanowires 120, electrons may flow more easily without energy barrier, but if a positive voltage is applied, a current may not flow easily due to the presence of an energy barrier. Thus, the graphene switching device 100 may function as a diode. Here also, a size of the energy barrier may be adjusted using a gate voltage. Meanwhile, when a negative voltage is applied to the second electrode 142, a current increases in an arrow direction B according to the increase in the gate voltage, and thus diode characteristics may be adjusted.

Figure 6A:
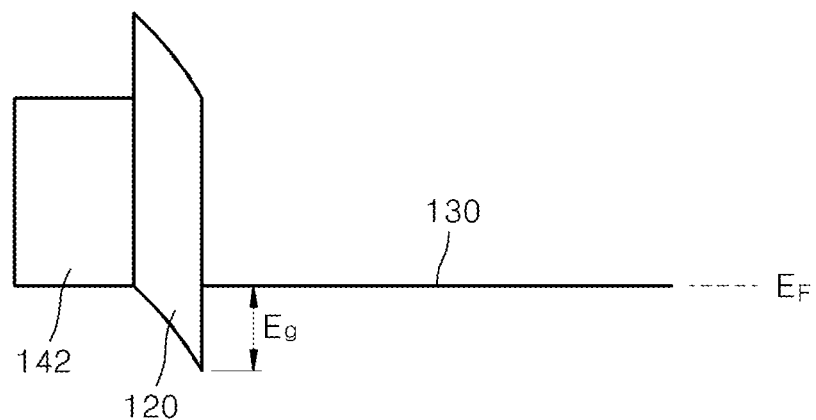
FIGS. 6A and 6B are energy band diagrams to explain an operation of a graphene switching device according to example embodiments.
Figure 6B:
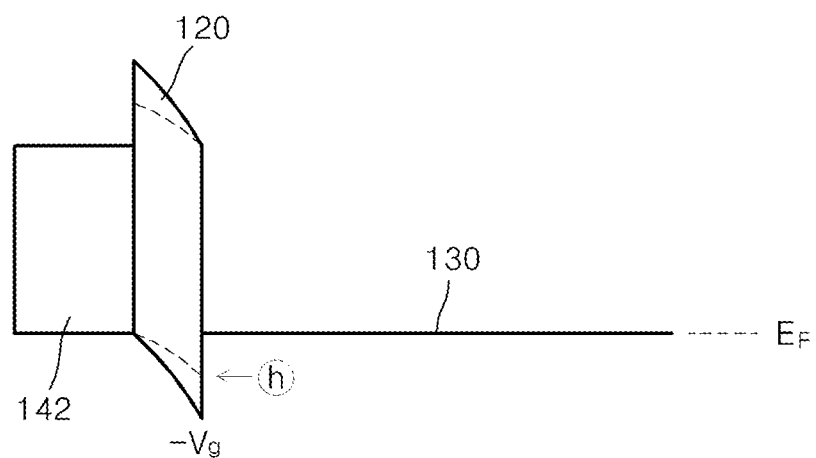

FIGS. 6A and 6B are energy band diagrams to explain an operation of a p-type graphene switching device, according to example embodiments. FIG. 6A illustrates a state before applying a gate voltage, and FIG. 6B illustrates a state after applying a gate voltage.

Referring to FIG. 6A, when no gate voltage is applied to the gate electrode 160, energy bands of the graphene layer 130 and the second electrode 142 corresponding to respective work functions of the graphene layer 130 and the second electrode 142 are formed at both sides of the semiconductor nanowires 120. When the graphene switching device 100 includes the semiconductor nanowires 120 of a p-type, the main carriers are holes. The semiconductor nanowires 120 between the second electrode 142 and the graphene layer 130 function as an energy barrier. According to the current example embodiment, the semiconductor nanowires 120 may be referred to as a semiconductor barrier. Due to an energy gap Eg between the graphene layer 130 and the semiconductor nanowires 120, movement of carriers is restricted. In FIGS. 6A and 6B, $E_F$ denotes a Fermi energy level of the graphene layer 130.

Referring to FIG. 6B, while applying a desired (or, alternatively, predetermined) voltage to the second electrode 142 and to the first electrode 141, when a desired (or, alternatively, predetermined) negative gate voltage (−Vg) is applied to the gate electrode 160, the energy gap Eg of the semiconductor nanowires 120 decreases as indicated by the dotted line. Thus, holes may easily flow from the graphene layer 130 to the second electrode 142. This indicates that a current flows through the graphene switching device 100 by the gate voltage, and accordingly, the graphene switching device 100 functions as a field effect transistor.

Meanwhile, due to the decrease in the energy gap Eg, holes may also pass through the semiconductor nanowires 120 due to a tunneling effect of the semiconductor nanowires 120, according to at least one example embodiment.

As the gate voltage increases, the energy gap Eg of the semiconductor nanowires 120 decreases further. Thus, the energy gap Eg of the semiconductor nanowires 120 may be adjustable.

Figure 7:
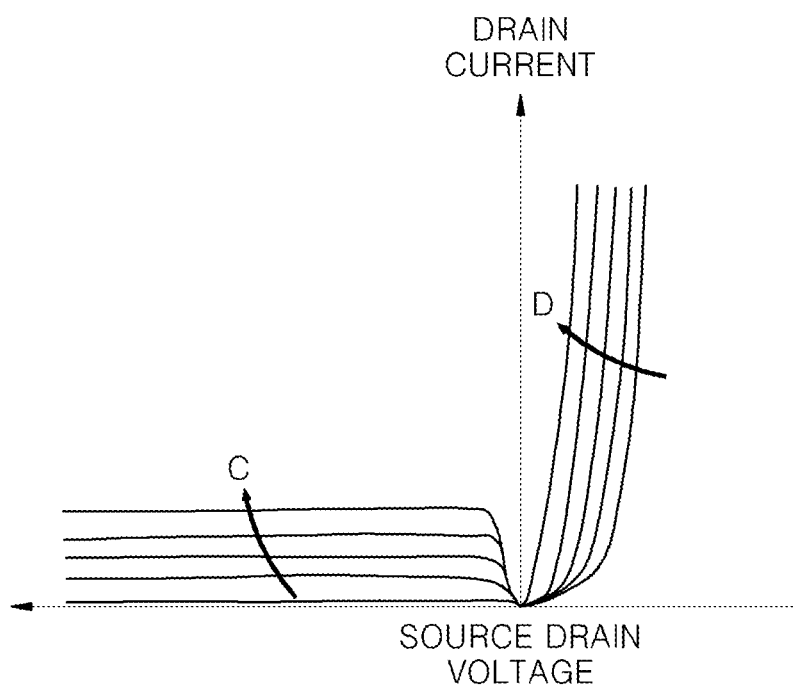
FIG. 7 is an I-V curve of a graphene switching device according to example embodiments.

FIG. 7 is an I-V curve of a p-type graphene switching device according to example embodiments.

Referring to FIG. 7, when a source-drain voltage is negative, an energy gap decreases with an increase in an absolute value of a negative gate voltage, and a drain current increases in an arrow direction C.

Meanwhile, if a positive voltage is applied to the second electrode 142 of the graphene switching device 100 including the p-type semiconductor nanowires 120, holes may flow more easily without any energy barrier, but if a negative voltage is applied, holes may not flow easily due to the presence of the energy barrier. Thus, the graphene switching device 100 may function as a diode. Here also, a height of the energy gap may be adjusted using a gate voltage. Meanwhile, when a positive voltage is applied to the second electrode 142, a current increases in an arrow direction D according to the increase in an absolute value of the gate voltage. Thus, diode characteristics may be adjusted according to the gate voltage.

As described above, according to example embodiments, as the semiconductor nanowires are used as a Schottky barrier in the flexible graphene switching device, a field effect transistor, which is a high-mobility electronic device and has a high ON/OFF ratio at the same time, may be provided. Also, a flexible electronic device may be easily realized.

It should be understood that the exemplary embodiments described therein should be considered in a descriptive sense only and not for purposes of limitation. Descriptions of features or example embodiments should typically be considered as available for other similar features in other embodiments.

While one or more example embodiments have been described with reference to the figures, it will be understood by those of ordinary skill in the art that various changes in form and details may be made therein without departing from the spirit and scope of the example embodiments as defined by the following claims.

What is claimed is:

1. A graphene switching device comprising:
a graphene layer on a substrate;
a plurality of semiconductor nanowires on the substrate, at least one of the plurality of semiconductor nanowires being connected to a first end of the graphene layer;
a first electrode connected to a second end of the graphene layer;
a second electrode on the substrate facing the first electrode so as to be connected to the plurality of semiconductor nanowires;
a gate insulating layer on the substrate to cover the graphene layer; and
a gate electrode on the gate insulating layer,
wherein the gate electrode and the plurality of semiconductor nanowires face each other with the graphene layer therebetween, and at least one of the plurality of semiconductor nanowires is connected to at least one of the second electrode, the graphene layer, and the other of the plurality of semiconductor nanowires.

2. The graphene switching device of claim 1, wherein the plurality of semiconductor nanowires are doped with n-type or p-type impurities.

3. The graphene switching device of claim 1, wherein the plurality of semiconductor nanowires include silicon, germanium, silicon-germanium, a III-V Group semiconductor, a II-VI group semiconductor or an organic semiconductor.

4. The graphene switching device of claim 1, wherein the graphene layer is separated from the second electrode.

5. The graphene switching device of claim 1, wherein a distance between the graphene layer and the second electrode is in a range from about 1 nm to about 30 nm.

6. The graphene switching device of claim 1, wherein the gate insulating layer comprises a polymer.

7. The graphene switching device of claim 1, wherein the graphene switching device is a unipolar transistor having the same polarity as a polarity of impurities of the plurality of semiconductor nanowires.

8. The graphene switching device of claim 1, wherein the plurality of semiconductor nanowires form an energy gap between the graphene layer and the second electrode, and the energy gap is configured to be varied according to a gate voltage applied to the gate electrode.

9. The graphene switching device of claim 1, wherein the graphene layer comprises one to four graphene layers.

10. The graphene switching device of claim 1, wherein the substrate comprises a plastic.

11. The graphene switching device of claim 1, wherein the plurality of semiconductor nanowires are distributed in a network form.

12. The graphene switching device of claim 1, wherein the plurality of semiconductor nanowires are configured to be parallel to one another.

13. The graphene switching device of claim 1, wherein the graphene switching device is flexible.

* * * * *